United States Patent
Liu et al.

(10) Patent No.: US 8,669,795 B2
(45) Date of Patent: Mar. 11, 2014

(54) NOISE FILTERING FRACTIONAL-N FREQUENCY SYNTHESIZER AND OPERATING METHOD THEREOF

(71) Applicant: National Taiwan University, Taipei (TW)

(72) Inventors: Shen-Iuan Liu, Taipei (TW); Kun-Hsun Liao, New Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 13/727,948

(22) Filed: Dec. 27, 2012

(65) Prior Publication Data

US 2014/0028355 A1  Jan. 30, 2014

(30) Foreign Application Priority Data

Jul. 26, 2012 (TW) .............................. 101126916 A

(51) Int. Cl.
*H03L 7/06* (2006.01)

(52) U.S. Cl.
USPC .......................................... 327/156; 327/147

(58) Field of Classification Search
USPC .................................................. 327/147, 156
See application file for complete search history.

(56) References Cited

U.S. PATENT DOCUMENTS

| | | | |
|---|---|---|---|
| 7,157,985 B2* | 1/2007 | Mitani et al. .................... | 332/119 |
| 7,221,921 B2* | 5/2007 | Maligeorgos et al. ......... | 455/260 |
| 7,885,369 B2* | 2/2011 | Beyer et al. ..................... | 375/376 |
| 2003/0003887 A1* | 1/2003 | Lim et al. ........................ | 455/147 |
| 2003/0078013 A1* | 4/2003 | Ferguson, Jr. ................... | 455/85 |
| 2004/0077327 A1* | 4/2004 | Lim et al. ........................ | 455/318 |
| 2004/0232995 A1* | 11/2004 | Thomsen et al. ................ | 331/2 |
| 2004/0232997 A1* | 11/2004 | Hein et al. ....................... | 331/16 |
| 2005/0152481 A1* | 7/2005 | Lin et al. ......................... | 375/346 |
| 2005/0242889 A1* | 11/2005 | Mitani et al. .................... | 331/16 |
| 2006/0068739 A1* | 3/2006 | Maeda et al. .................... | 455/295 |
| 2006/0122806 A1* | 6/2006 | Rifani et al. .................... | 702/177 |
| 2007/0080835 A1* | 4/2007 | Maeda et al. .................... | 341/120 |
| 2010/0008459 A1* | 1/2010 | Eldredge et al. ............... | 375/371 |
| 2011/0116558 A1* | 5/2011 | Otaka et al. ..................... | 375/259 |
| 2011/0200076 A1* | 8/2011 | Mu et al. .......................... | 375/219 |
| 2011/0298507 A1* | 12/2011 | Jakobsson et al. .............. | 327/156 |
| 2012/0176202 A1* | 7/2012 | Chen et al. ...................... | 331/34 |

* cited by examiner

*Primary Examiner* — Adam Houston
(74) *Attorney, Agent, or Firm* — Bacon & Thomas, PLLC

(57) ABSTRACT

The present invention discloses a noise filtering fractional-n frequency synthesizer and an operating method thereof. The noise filtering fractional-n frequency synthesizer comprises a filter, a frequency calibration loop, a phase calibration loop and a digitally controlled delay line. The filter receives a first frequency division signal and generates a filtered signal. The frequency calibration loop is coupled to the filter and generates a first control signal. The phase calibration loop is coupled to the filter and the frequency calibration loop, and generates a second control signal. The digitally controlled delay line is coupled to the phase calibration loop and receives the second control signal. Thus, quantization noise of the fractional-n frequency synthesizer can be reduced, and phase noise of the fractional-n frequency synthesizer can be improved. In addition, the system remains locked after the filter outputs the signal.

14 Claims, 7 Drawing Sheets

NOISE FILTERING FRACTIONAL-N FREQUENCY SYNTHESIZER AND OPERATING METHOD THEREOF

BACKGROUND OF THE INVENTION

1. Field of the Invention

The present invention relates to a frequency synthesizer, and more particularly, to a noise filtering fractional-n frequency synthesizer.

2. Description of the Prior Art

Conventional integer-N frequency synthesizers have very small channel spacings in general. To overcome this drawback, fractional-n frequency synthesizers have been developed, in which a divisor can be a fractional value and the synthesized frequency to be output may be a non-integer multiple of the reference frequency.

FIG. 1 shows a block diagram of a conventional fractional-n frequency synthesizer. The conventional fractional-n frequency synthesizer 100 comprises a phase frequency detector 101, a charge pump 102, a loop filter 103, a voltage-controlled oscillator 104, and a multi-modulus dividers 105. The conventional fractional-n frequency synthesizer 100 generates an output signal $S_{out}$ based on an input signal $S_{ref}$. The input signal $S_{ref}$ is generated by a clock source 110, which may be a crystal oscillator. The phase frequency detector 101 receives the input signal $S_{ref}$ and a feedback signal $S_{fb}$, compares the phase or frequency between them, and then sends a first switch signal $S_{up}$ and a second switch signal $S_{dn}$ to the charge pump 102. If the frequency of the feedback signal $S_{fb}$ is lower than that of the input signal $S_{ref}$, the charge pump 102 will charge the loop filter 103 to increase the input voltage $V_{ctrl}$ which is input to the voltage-controlled oscillator 104, so that the frequency of the output signal $S_{out}$ increases and thus causes the frequency of the feedback signal $S_{fb}$ to increase accordingly. Similarly, if the frequency of the feedback signal $S_{fb}$ is higher than that of the input signal $S_{ref}$, the charge pump 102 will discharge the loop filter 103, and consequently, the frequency of the feedback signal $S_{fb}$ will be reduced. Until after the phase frequency detector 101 detects that the frequency of the input signal $S_{ref}$ is equal to that of the feedback signal $S_{fb}$, the conventional fractional-n frequency synthesizer 100 will be locked. When it is locked, the frequency of the output signal $S_{out}$ approximately equals the frequency of the input signal $S_{ref}$ divided by the divisor set in the multi-modulus dividers 105.

The main problem of a conventional fractional-n frequency synthesizer is that the divisor is a result of dynamic average; that is, a direct non-integer divisor cannot be realized. Therefore, a discrepancy exists between the actual instantaneous divisor generated and an ideal non-integer divisor. The result is that the output frequencies are in a state of dynamic balance when the fractional-n frequency synthesizer is locked, and the problem of quantization noise also rises.

A conventional fractional-n frequency synthesizer adopts a non-integral frequency divider which can dynamically switch between variable divisors, so that a non-integer divisor can be realized. However, a discrepancy exists between the actual instantaneous divisor generated and an ideal non-integer divisor. Moreover, since the divisor is variable, the phase of the signal fed back from the frequency divider to the phase frequency divider will also fluctuate. Thus, the phases of the feedback signal and the reference signal cannot be aligned, thereby causing the output frequencies in a state of dynamic balance when the fractional-n frequency synthesizer is locked. Although signals having a frequency of non-integer multiple are obtained, the phases of the feedback signal and the reference signal cannot be aligned.

Therefore, in comparison with a locked integral frequency divider, a non-integral frequency divider cannot really align the reference signal and the feedback signal; rather, only the average phase differences become close. This causes the quantization noise problems for fractional-n frequency synthesizers.

Quantization noise results from dynamic balance of the divisors, which makes the phases of the reference signal and the feedback signal unable to align. At the instant when the divisor varies, the phase will undergo a greater change. Thus, noise-filtering techniques are often adopted to suppress quantization noise by employing circuit arrangements to reduce the phase change.

However, how to reduce the phase change is a major problem. One of the conventional techniques utilizes a phase-locked loop, which acts as a low-pass filter in the phase domain, to connect serially to the output end of the frequency divider. Since the low-pass effect can be considered as generating an average of results, it would be better to generate at first an average of the phases for the signals output from the original frequency divider. This technique aims to reduce phase jitter and further reduce quantization noise.

SUMMARY OF THE INVENTION

In view of the drawbacks of a conventional frequency synthesizer as described above, the present invention aims to provide a noise filtering fractional-n frequency synthesizer and an operating method thereof. Objects of the present invention includes improving the problem of quantization noise, providing a system which can stay locked after calibration, and reducing power consumption.

The basic difference between the present invention and the prior art is that instead of using a serially connected phase-locked loop, this invention adopts an injection-locked oscillator, a frequency calibration loop, and a phase calibration loop to achieve the low-pass filtering effect.

According to an object of the present invention, a noise filtering fractional-n frequency synthesizer is provided, which comprises: a filter, a frequency calibration loop, a phase calibration loop, a digitally controlled delay line, and a multiplexer. The filter comprises a pulse generator and an injection-locked oscillator having a natural frequency of oscillation; the filter receives a first frequency division signal and generates a first filtered signal. The frequency calibration loop is coupled to the filter and generates a first control signal to adjust the natural frequency of oscillation of the injection-locked oscillator. The frequency calibration loop comprises a frequency detector and a register controller. The frequency detector receives a second frequency division signal and the filtered signal; the register controller is coupled to the frequency detector and outputs the first control signal to the injection-locked oscillator. The phase calibration loop is coupled to the frequency calibration loop, generating a second control signal; the phase calibration loop comprises a phase detector and an up/down counter. The phase detector, which may be a D flip-flop, is coupled to the filter and the digitally controlled delay line; the up/down counter is coupled to the phase detector and outputs the second control signal to the digitally controlled delay line. The digitally controlled delay line is coupled to the phase calibration loop and receives the second control signal; it also receives the first frequency division signal and generates the second frequency division signal. The multiplexer is coupled to the filter and the digitally controlled delay line.

According to another object of the present invention, a method of operating a frequency synthesizer is provided for use with a noise filtering fractional-n frequency synthesizer circuit, the circuit including a filter, a frequency calibration loop, a phase calibration loop, and a digitally controlled delay line. The method of operating a frequency synthesizer includes the following steps: based on a filtered signal output by the filter and a second frequency division signal output by the digitally controlled delay line, the frequency calibration loop generates a first control signal to the filter; based on the first control signal, the filter calibrates its natural frequency of oscillation; based on the filtered signal, the second frequency division signal and the output of the frequency calibration loop, the phase calibration loop generates a second control signal to the digitally controlled delay line; and based on the second control signal, the digitally controlled delay line calibrates a phase of a first frequency division signal and generates the second frequency division signal.

Based on the above concept of the invention, the filter further comprises an injection-locked oscillator having a natural frequency of oscillation; the frequency calibration loop comprises a frequency detector and a register controller; and the method of operating a frequency synthesizer further includes the following step: the frequency detector detects a difference in frequency between the second frequency division signal and the filtered signal, and based on the detected difference in frequency, the register controller modulates the natural frequency of oscillation of the injection-locked oscillator.

Based on the above concept of the invention, the phase calibration loop further comprises a phase detector, which may be a D flip-flop, and an up/down counter, and the method of operating a frequency synthesizer further includes the following step: the phase detector detects a difference in phase between the second frequency division signal and the filtered signal, and based on the detected difference in phase, the up/down counter outputs the second control signal to control the digitally controlled delay line.

Based on the above concept of the invention, the method of operating a frequency synthesizer further includes the following step: the noise filtering fractional-n frequency synthesizer circuit uses a delta-sigma modulator to provide divisor-switching function, wherein the delta-sigma modulator is coupled to a frequency divider, which may be a multi-modulus divider.

Based on the above concept of the invention, the method of operating a frequency synthesizer further includes the following step: the noise filtering fractional-n frequency synthesizer circuit uses a multiplexer to switch between the second frequency division signal and the filtered signal to generate a feedback signal.

As described above, compared to a conventional fractional-n frequency synthesizer, the fractional-n frequency synthesizer of the present invention can generate an average result for the phase change first; as a result, the instantaneous frequency jitter due to variable divisors can be improved, and quantization noise can be filtered. Moreover, a digitally controlled frequency calibration loop and phase calibration loop are added to the circuit; as a result, the system can remain locked after the signal is output from the filter, thereby improving the stability of the system. Further, compared to the conventional technique which uses a serially connected phase-locked loop, the present invention consumes a smaller area. Also, since the system can remain locked after calibration is carried out, the frequency calibration loop and the phase calibration loop can be powered off after calibration; thus, less power consumption can be realized through the present invention.

These and other features, aspects, and advantages of the invention will be described in more detail below hereinafter with reference to the accompanying drawings, in which preferred embodiments of the invention are shown. It is to be understood that all kinds of alterations and changes can be made by those skilled in the art without deviating from the spirit and the scope of the invention. This description is not to be taken in a limiting sense, but is made merely for the purpose of illustrating the general principles of the invention.

DETAILED DESCRIPTION OF THE PREFERRED EMBODIMENTS

Figure 1:
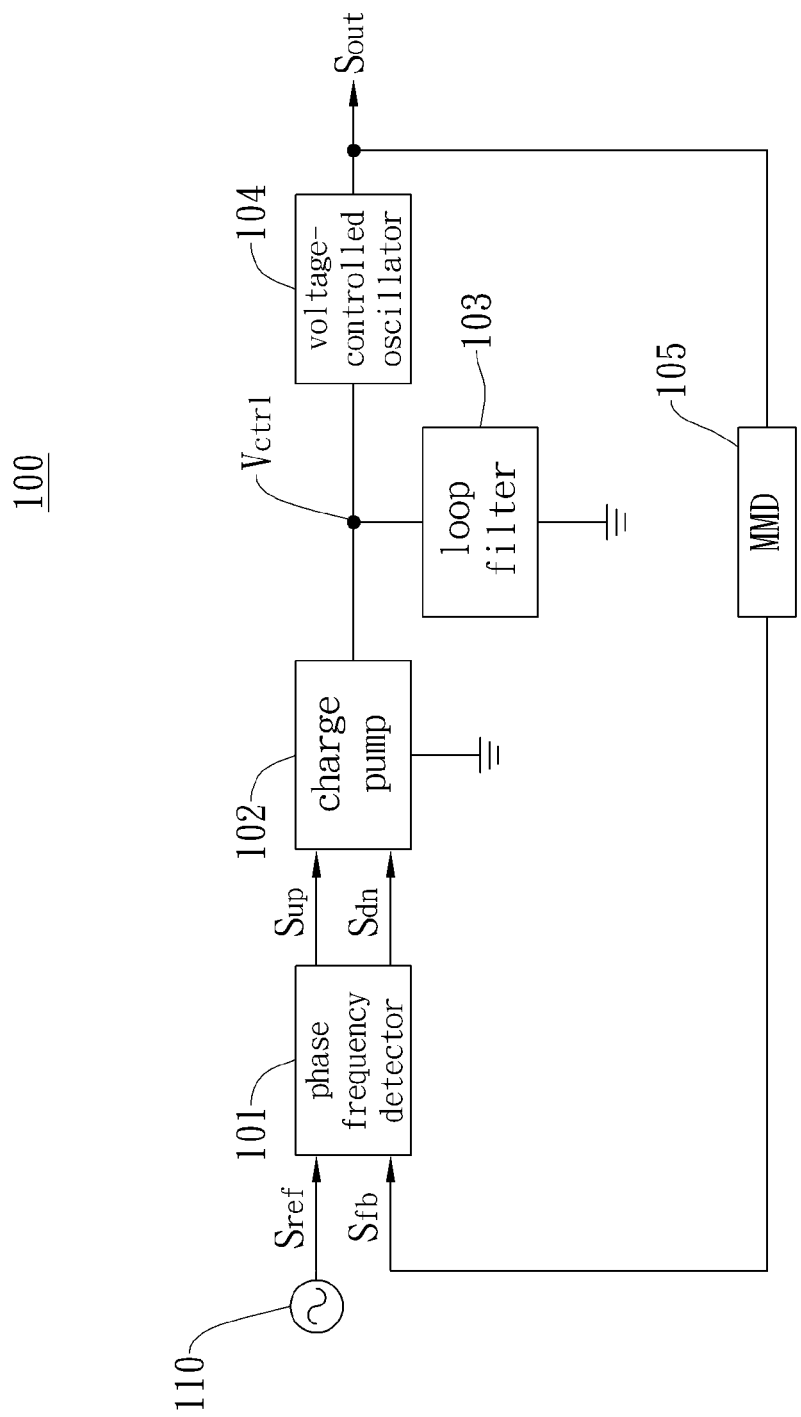
FIG. 1 shows a block diagram of a conventional fractional-n frequency synthesizer.

The present invention now will be described more fully hereinafter with reference to the accompanying drawings. Numerals mentioned in the following description refer to those shown in the drawings.

Figure 2:
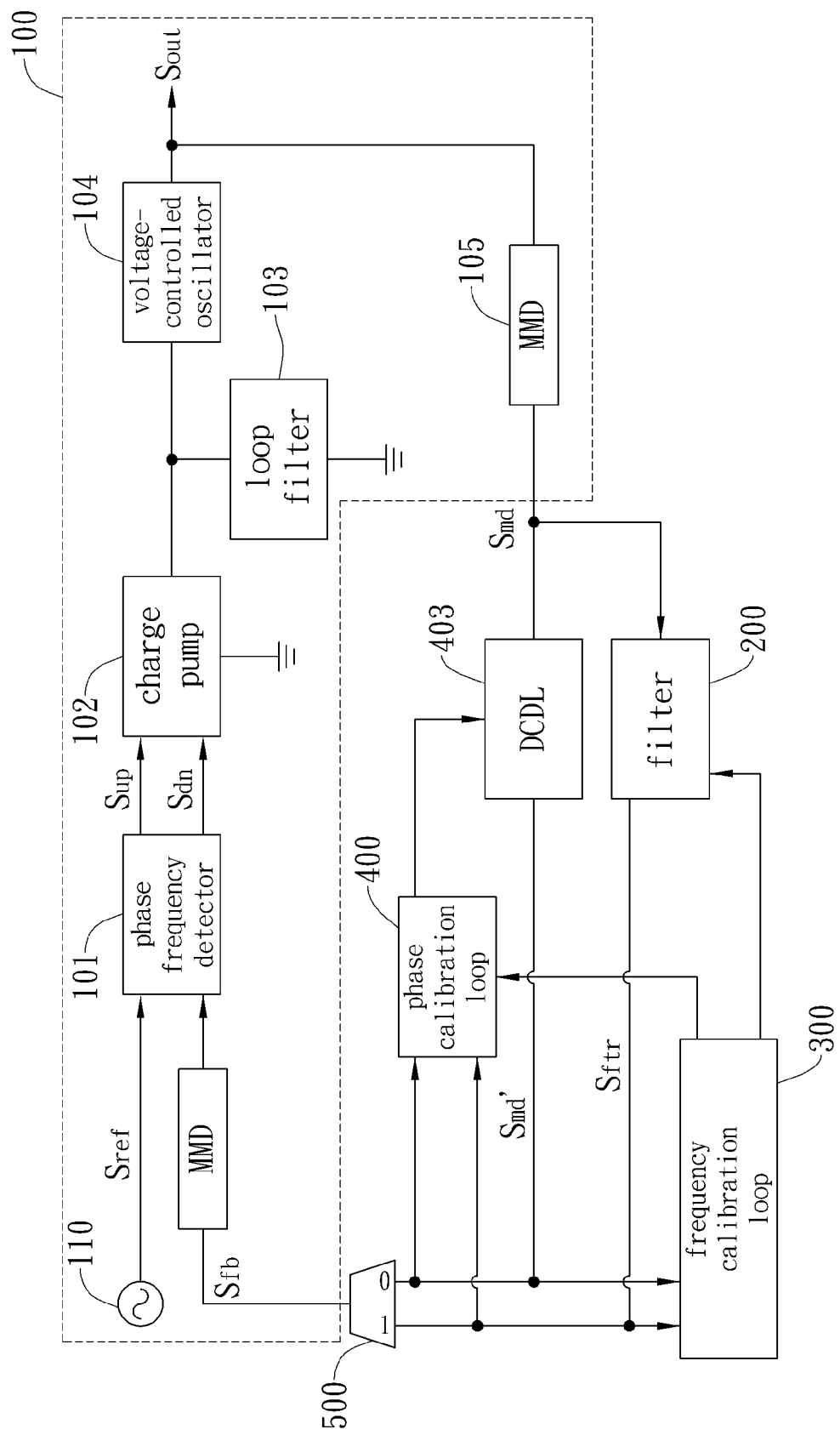
FIG. 2 shows a block diagram of a noise filtering fractional-n frequency synthesizer of the present invention.

FIG. 2 shows a block diagram of a noise filtering fractional-n frequency synthesizer of the present invention. As FIG. 2 shows, the noise filtering fractional-n frequency synthesizer of the present invention comprises a phase frequency detector 101, a charge pump 102, a loop filter 103, a voltage-controlled oscillator 104, a multi-modulus dividers 105, a filter 200, a frequency calibration loop 300, a phase calibration loop 400, a digitally controlled delay line 403, and a multiplexer 500. It should be noted that the phase frequency detector 101, the charge pump 102, the loop filter 103, the voltage-controlled oscillator 104, and the multi-modulus dividers 105 constitute the conventional fractional-n frequency synthesizer 100 as described above. The operation of the noise filtering fractional-n frequency synthesizer according to the present invention is as follows. A clock source 110 generates an input signal $S_{ref}$ to the phase frequency detector 101. The phase frequency detector 101 receives the input signal $S_{ref}$ and a feedback signal $S_{fb}$, compares the phase or frequency between them, and then sends a first switch signal $S_{up}$ and a second switch signal $S_{dn}$ to the charge pump 102. If the frequency of the feedback signal $S_{fb}$ is lower than that of the input signal $S_{ref}$, the charge pump 102 will charge the loop filter 103 to increase the input voltage $V_{ctrl}$ input to the voltage-controlled oscillator 104; on the contrary, if the frequency of the feedback signal $S_{fb}$ is higher than that of the input signal $S_{ref}$, the charge pump 102 will discharge the loop filter 103 to reduce the input voltage $V_{ctrl}$ input to the voltage-controlled oscillator 104. The voltage-controlled oscillator 104 generates an output signal $S_{out}$ based on the input voltage $W_{ctrl}$. The multi-modulus dividers 105, coupled to the voltage-controlled oscillator 104, provides an adjustable divisor D and outputs a first frequency division signal $S_{md}$. The divisor D, which can be a non-integer, is for modulating the frequency of the output signal $S_{out}$. The filter 200, coupled to the multi-modulus dividers 105, is used to reduce the quantization noise in the first frequency division signal $S_{md}$ and to generate a filtered signal $S_{ftr}$. The frequency calibration loop 300, coupled to the filter 200, generates a digital control signal according to the filtered signal $S_{ftr}$ to modulate the frequency of the filter 200. The phase calibration loop 400, coupled to the frequency calibration loop 300, generates a digital control signal to control the digitally controlled delay line 403 according to the received filtered signal $S_{ftr}$ and a second frequency division signal $S_{md'}$ output by the digitally controlled delay line 403. The digitally controlled delay line 403 is coupled to the multi-modulus dividers 105, the frequency calibration loop 300, and the phase calibration loop 400; it calibrates and aligns the phases of the first frequency division signal $S_{md}$ and the filtered signal $S_{ftr}$ based on the digital control signal received from the phase calibration loop 400, and then generates the second frequency division signal $S_{md'}$ to output to the multiplexer 500. After that, the conventional fractional-n frequency synthesizer 100 of the circuit is locked first, and the multiplexer 500 outputs the first frequency division signal $S_{md}$ as the feedback signal $S_{fb}$. Next, the frequency calibration loop 300 modulates the filter 200; the first frequency division signal $S_{md}$ output by the multi-modulus dividers 105 is also input to the filter 200. Then, the phase calibration loop 400 aligns the phases of the second frequency division signal $S_{md'}$ and the filtered signal $S_{ftr}$ at the input end of the multiplexer 500. The multiplexer 500 then switches to the output path and outputs the filtered signal $S_{ftr}$ as the feedback signal $S_{fb}$. In the end, the noise filtering fractional-n frequency synthesizer of the present invention generates an output signal $S_{out}$, and the frequency of the output signal $S_{out}$ approximately equals the frequency of the input signal $S_{ref}$ divided by the divisor set in the multi-modulus dividers 105.

Figure 3:
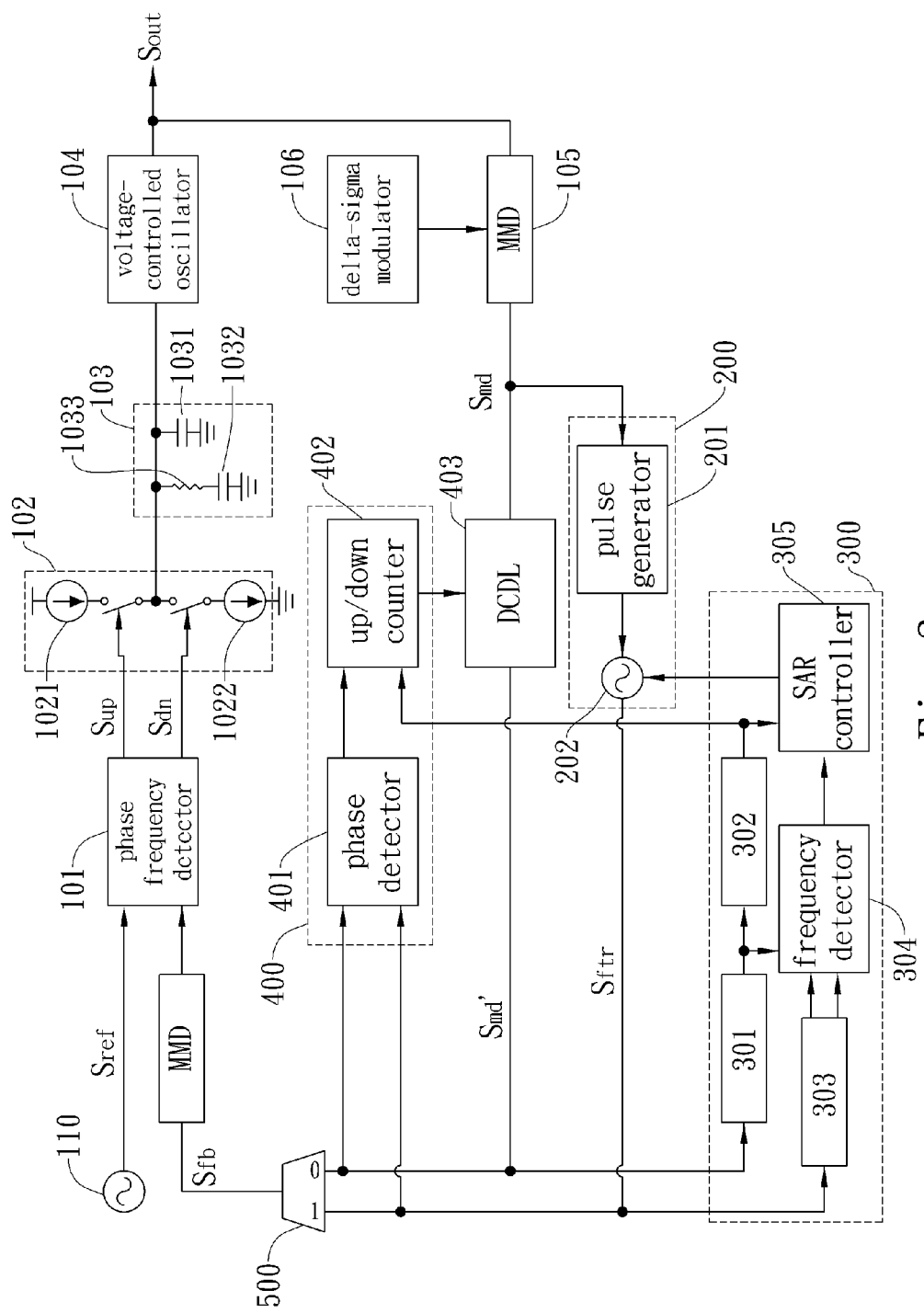
FIG. 3 shows a possible embodiment of the noise filtering fractional-n frequency synthesizer according to the present invention.

FIG. 3 shows a possible embodiment of the noise filtering fractional-n frequency synthesizer according to the present invention. As shown in FIG. 3, in this embodiment, a charge pump 102 is formed by a first current source 1021 and a second current source 1022; the first and second current sources may be PMOS transistors or NMOS transistors. A charge pump 103 in this embodiment is formed by a first capacitor 1031, a second capacitor 1032, and a resistor 1033. The first capacitor 1031 is connected in parallel with the second capacitor 1032 and the resistor 1033, and the second capacitor 1032 is connected in series with the resistor 1033. In this embodiment, a delta-sigma modulator 106 is utilized to switch between the divisor Ds for the multi-modulus dividers 105; the delta-sigma modulator 106 generates a divisor-switching signal. A filter 200 in this embodiment is formed by a pulse generator 201 and an injection-locked oscillator 202, wherein the injection-locked oscillator 202 can change the range of its natural frequency of oscillation according to the digital output of the frequency calibration circuit. The signal input to the injection-locked oscillator 202, i.e. the first frequency division signal $S_{md}$, should have a frequency within the lock range of the oscillator 202's natural frequency of oscillation, so that effective noise filtering can be carried out. As described above, the conventional fractional-n frequency synthesizer is locked first during the circuit operation; thus, the output signal of the multi-modulus dividers 105 now will have a known frequency that is equal to, or is an integer multiple of, that of the input signal $S_{ref}$. In this embodiment, a frequency calibration loop 300 is formed by frequency dividers 301, 302, and 303, a frequency detector 304, and a successive approximation register controller 305. The frequency detector 304 is used to detect the frequency difference between the second frequency division signal $S_{md'}$ and the filtered signal $S_{ftr}$. Then, by automatic control through the digital control signals, the successive approximation register controller 305 adjusts and calibrates the injection-locked oscillator 202's natural frequency of oscillation according to the detected difference, so that the natural frequency of oscillation gets approximate to the frequency of the input signal and falls within the lock range. Therefore, the filter 200 can have the effect of noise filtering. In this embodiment, a phase calibration loop 400 is formed by a phase detector 401 and an up/down counter 402. The phase detector 401 is used to detect the phase difference between the second frequency division signal $S_{md'}$ and the filtered signal $S_{ftr}$. Then, by automatic control through the digital control signals, the up/down counter 402 controls the digitally controlled delay line 403 according to the detected difference, and makes the phases of the second frequency division signal $S_{md'}$ and the filtered signal $S_{ftr}$ aligned at the input end of a multiplexer 500. The phase detector 401 may be a D flip-flop.

It should be noted that although the filter, the phase calibration loop, and the frequency calibration loop in the embodiments of this invention are formed by the elements as described above, those having ordinary knowledge in the art shall understand that without departing from the spirit and scope of the present invention, the filter, the phase calibration loop, and the frequency calibration loop may be formed by other combination of elements.

Figure 4:
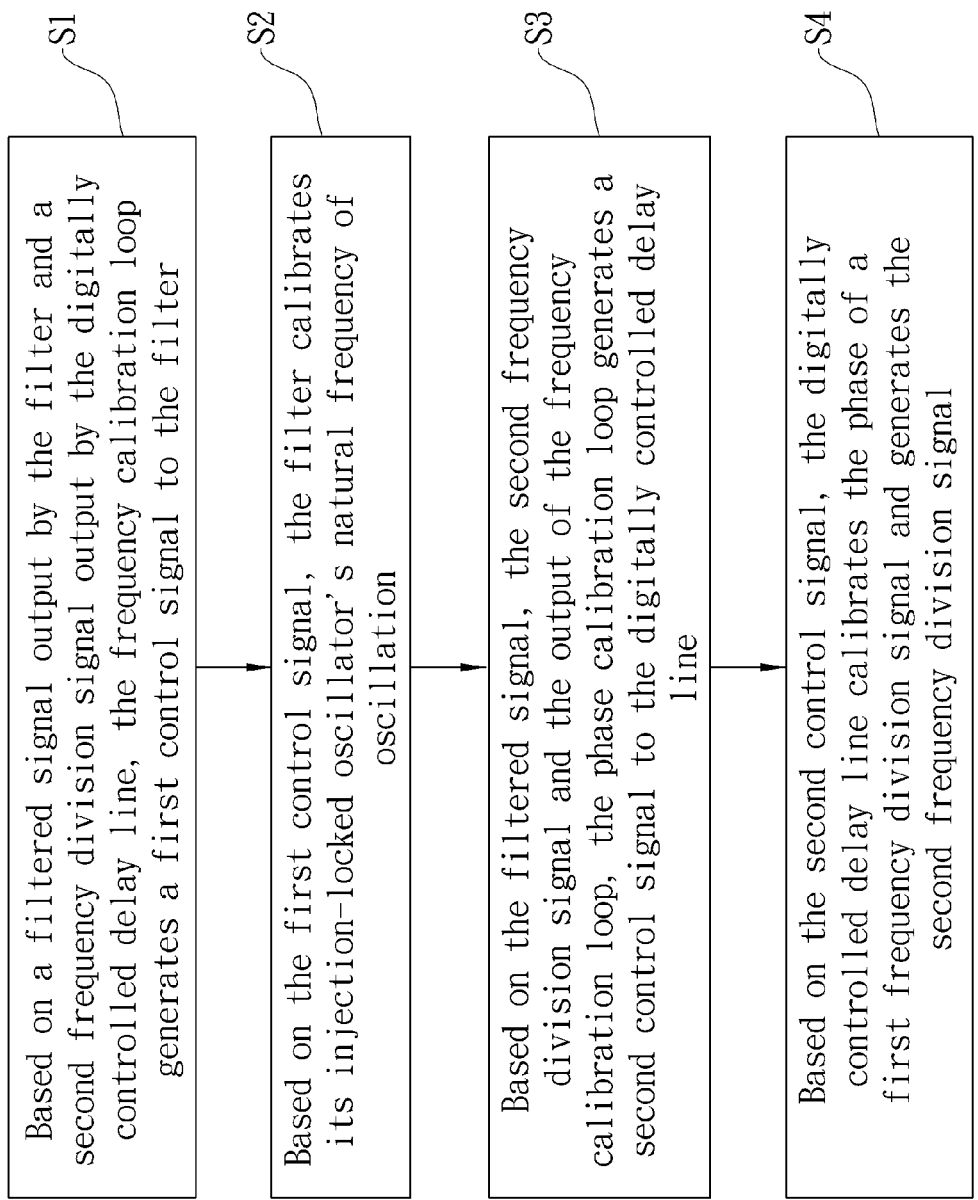
FIG. 4 is a flow chart showing the operation of a noise filtering fractional-n frequency synthesizer according to the present invention.

FIG. 4 is a flow chart showing the operation of a noise filtering fractional-n frequency synthesizer according to the present invention. A method of operating a frequency synthesizer as shown in FIG. 4 is applicable to a noise filtering fractional-n frequency synthesizer circuit. The noise filtering fractional-n frequency synthesizer circuit includes a filter, a frequency calibration loop, a phase calibration loop, and a digitally controlled delay line, wherein the filter comprises an injection-locked oscillator. According to the present invention, the method of operating a frequency synthesizer includes the following steps.

Step S1: Based on a filtered signal output by the filter and a second frequency division signal output by the digitally controlled delay line, the frequency calibration loop generates a first control signal to the filter.

Step S2: Based on the first control signal, the filter calibrates its injection-locked oscillator's natural frequency of oscillation.

Step S3: Based on the filtered signal, the second frequency division signal and the output of the frequency calibration loop, the phase calibration loop generates a second control signal to the digitally controlled delay line.

Step S4: Based on the second control signal, the digitally controlled delay line calibrates the phase of a first frequency division signal and generates the second frequency division signal.

Detailed description and embodiments regarding the method of operating a noise filtering fractional-n frequency synthesizer of the present invention have been given above and thus will not be repeated hereinafter.

Figure 5A:
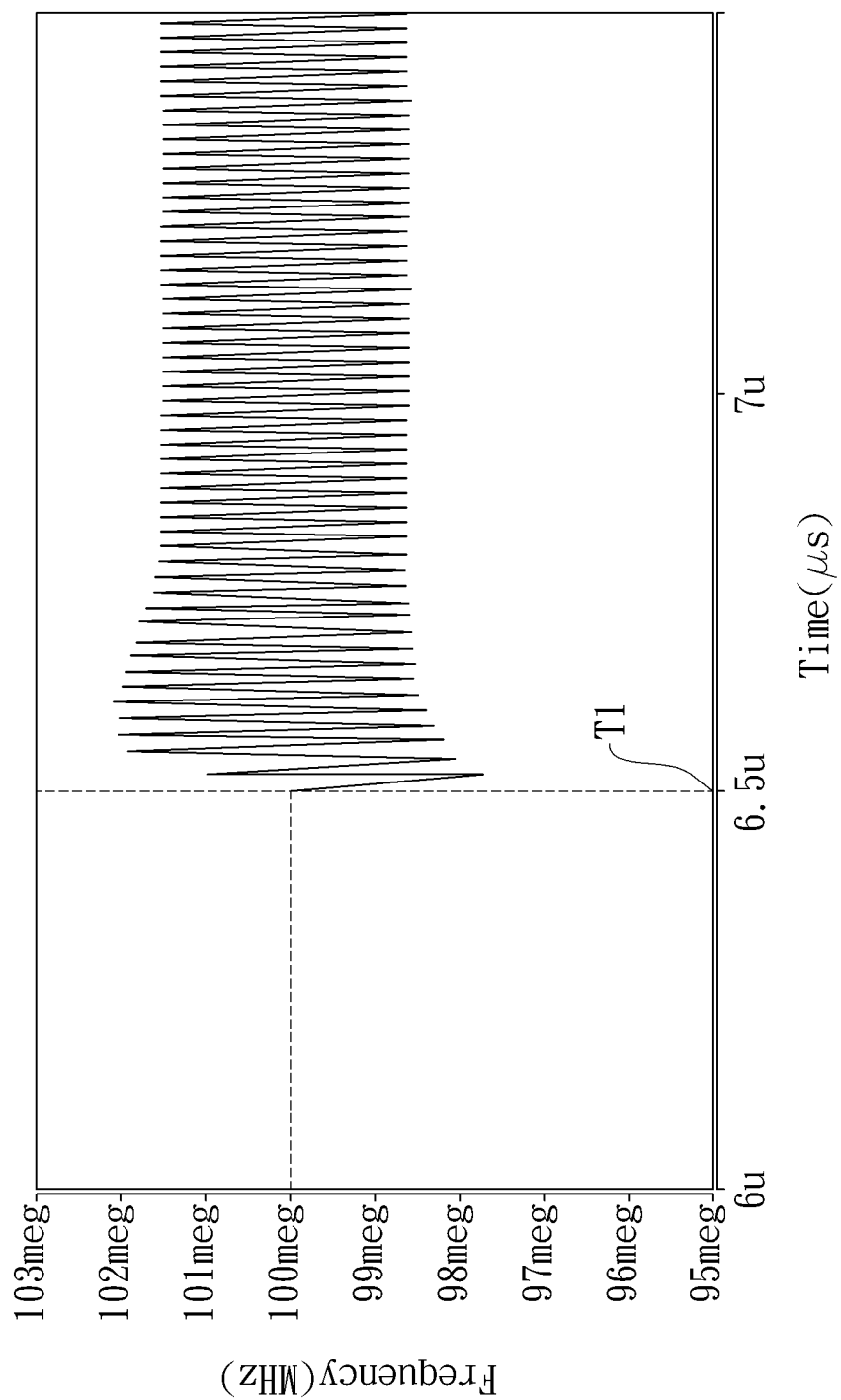
FIG. 5a is a diagram showing the measurement of quantization error for a conventional fractional-n frequency synthesizer.
Figure 5B:
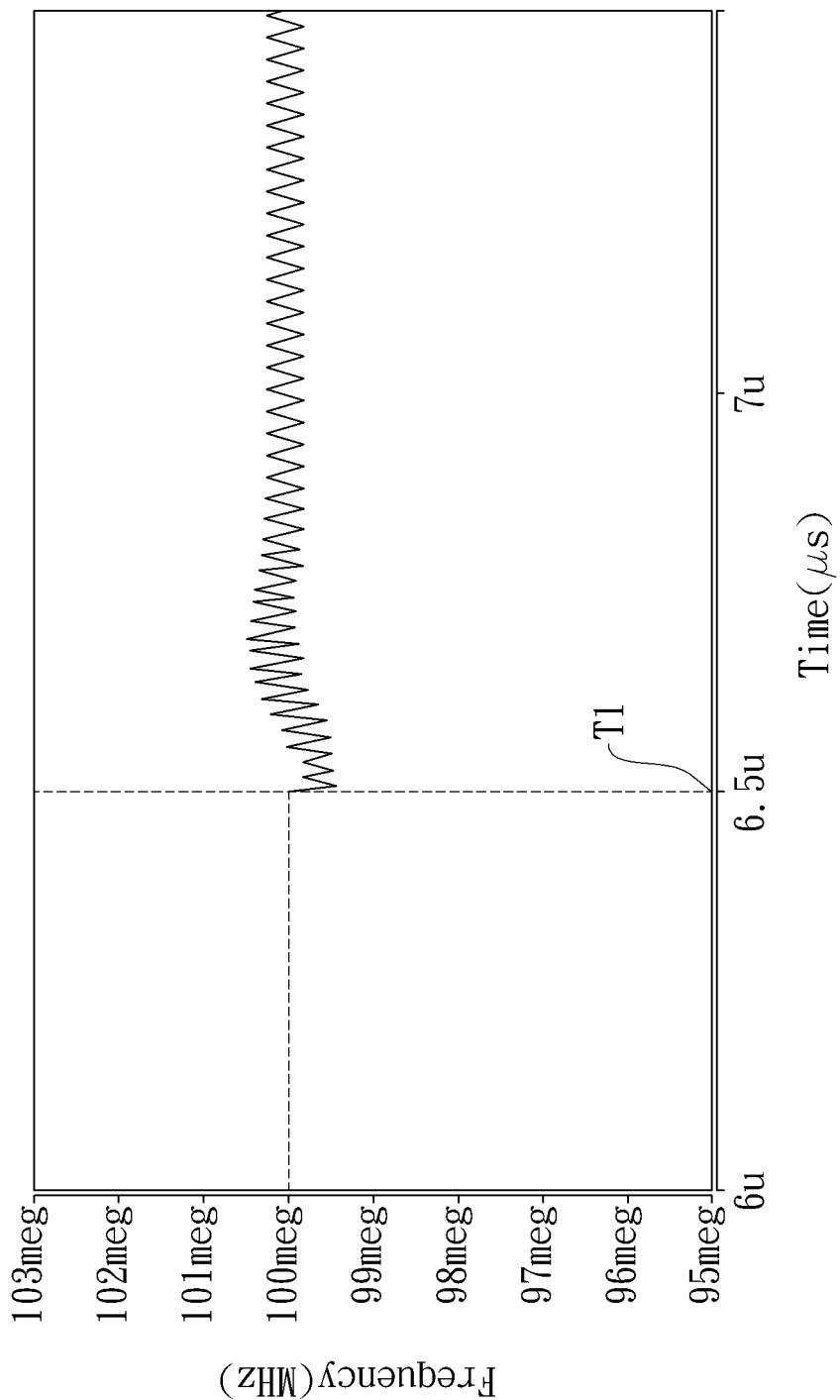
FIG. 5b is a diagram showing the measurement of quantization error for a fractional-n frequency synthesizer according to the present invention.

A conventional fractional-n frequency synthesizer disturbs multiple sets of integer divisors to generate fractional values for divisors. When the conventional frequency synthesizer is locked, one can observe that the instantaneous output frequency of the frequency divider will jitter; this is because the divisors are changing continuously. FIG. 5a is a diagram showing the measurement of quantization error for a conventional fractional-n frequency synthesizer. As shown in FIG. 5a, at time point T1, the divisor began to vary, and the frequency thus jittered from time point T1 according to the change of the divisor. It is seen from FIG. 5a that the range of frequency variation for the conventional fractional-n frequency synthesizer is quite large, meaning the quantization error is more severe. FIG. 5b is a diagram showing the measurement of quantization error for a fractional-n frequency synthesizer according to the present invention. As shown in FIG. 5b, in comparison with the conventional fractional-n frequency synthesizer, the synthesizer of the present invention has a range of frequency variation that is narrowed down considerably because of the filtering circuit in this invention. This means that the noise filtering fractional-n frequency synthesizer of the present invention can improve quantization error significantly.

Figure 6:
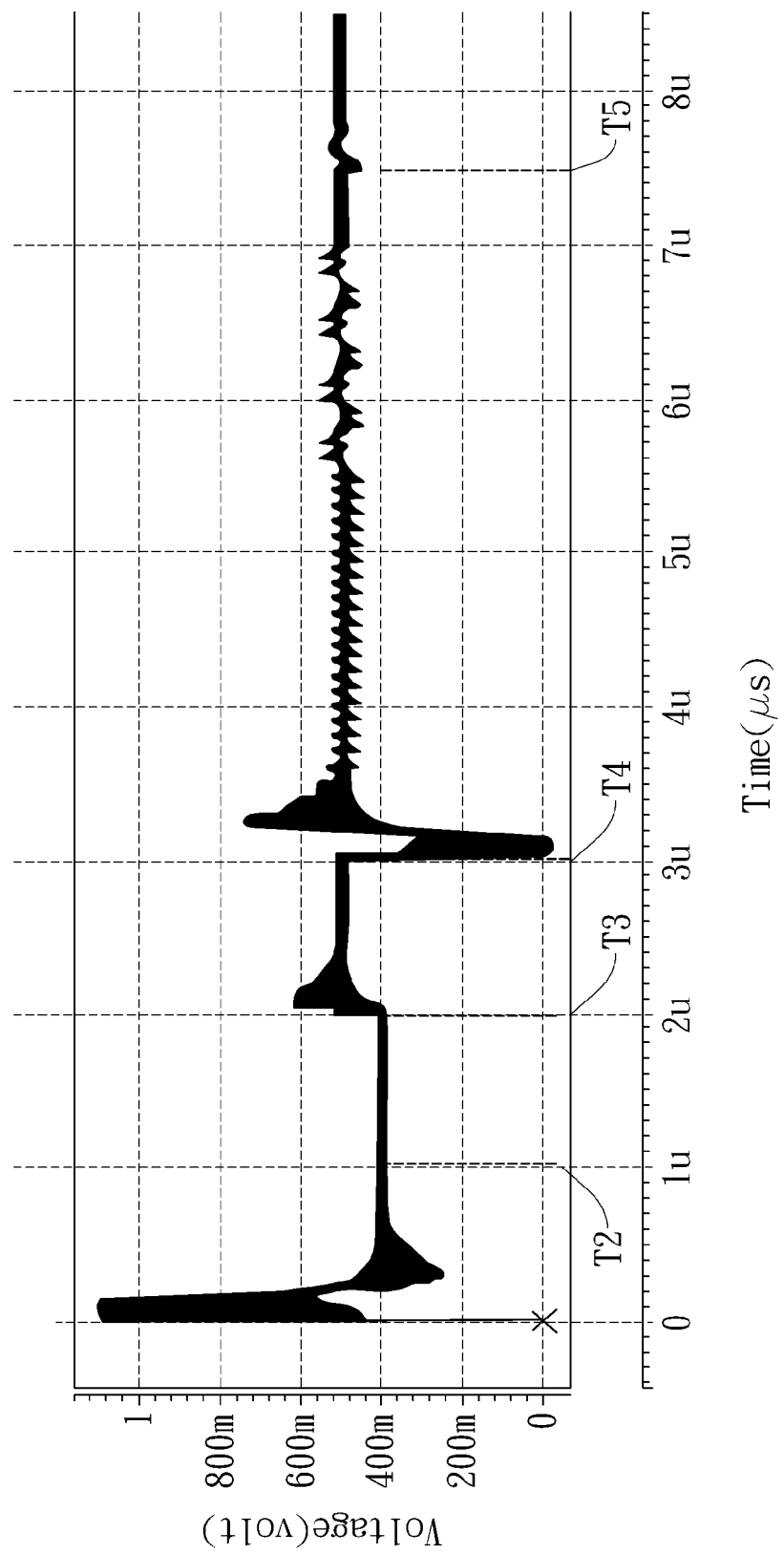
FIG. 6 is a diagram showing voltage control in the loop filter of the present invention.

FIG. 6 is a diagram showing voltage control in the loop filter of the present invention. As shown in FIG. 6, at time point T2, the frequency calibration loop begins to calibrate the frequency of the injection-locked oscillator. At time point T3, the divisor begins to vary. At time point T4, the phase calibration loop begins to calibrate and align the second frequency division signal and the filtered signal. At time point T5, the system switches to use the filtered signal output from the filter as the feedback signal. It is seen from FIG. 6 that adding calibration loops improves the stability of the circuit; besides, when the filter outputs signals after calibration, the system will still remain locked. Thus, the stability of the system is also improved through the present invention.

While this invention has been described by way of examples and in terms of preferred embodiments, it is to be understood that this invention is not limited hereto, and that various changes and modifications can be made by those skilled in the art without departing from the spirit and scope of this invention. It is intended that the scope of the invention be defined by the claims appended hereto.

What is claimed is:

1. A noise filtering fractional-n frequency synthesizer, comprising:
    a filter receiving a first frequency division signal and generating a filtered signal;
    a frequency calibration loop coupled to the filter, the frequency calibration loop generating a first control signal;
    a phase calibration loop coupled to the filter and the frequency calibration loop, the phase calibration loop generating a second control signal; and
    a digitally controlled delay line coupled to the phase calibration loop for receiving the second control signal, the digitally controlled delay line also receiving the first frequency division signal and generating a second frequency division signal.

2. The noise filtering fractional-n frequency synthesizer according to claim 1, wherein the filter comprises a pulse generator and an injection-locked oscillator.

3. The noise filtering fractional-n frequency synthesizer according to claim 2, wherein the frequency calibration loop comprises:
    a frequency detector receiving the second frequency division signal and the filtered signal; and
    a register controller coupled to the frequency detector, the register controller outputting the first control signal to the injection-locked oscillator.

4. The noise filtering fractional-n frequency synthesizer according to claim 2, wherein the injection-locked oscillator has a natural frequency of oscillation modulated and controlled by the frequency calibration loop.

5. The noise filtering fractional-n frequency synthesizer according to claim 1, wherein the phase calibration loop comprises:
    a phase detector coupled to the filter and the digitally controlled delay line; and
    an up/down counter coupled to the phase detector, the up/down counter outputting the second control signal to the digitally controlled delay line.

6. The noise filtering fractional-n frequency synthesizer according to claim 5, wherein the phase detector is a D flip-flop.

7. The noise filtering fractional-n frequency synthesizer according to claim 1, further comprising a multiplexer coupled to the filter and the digitally controlled delay line.

8. A method of operating a frequency synthesizer for use with a noise filtering fractional-n frequency synthesizer circuit, wherein the noise filtering fractional-n frequency synthesizer circuit includes a filter, a frequency calibration loop, a phase calibration loop, and a digitally controlled delay line; and wherein the method of operating a frequency synthesizer includes the following steps:
    based on a filtered signal output by the filter and a second frequency division signal output by the digitally controlled delay line, the frequency calibration loop generates a first control signal to the filter; based on the first control signal, the filter calibrates its natural frequency of oscillation; and
    based on the filtered signal, the second frequency division signal and the output of the frequency calibration loop, the phase calibration loop generates a second control signal to the digitally controlled delay line; based on the second control signal, the digitally controlled delay line calibrates a phase of a first frequency division signal and generates the second frequency division signal.

9. The method of operating a frequency synthesizer according to claim 8, wherein the filter comprises an injection-locked oscillator having a natural frequency of oscillation, and the frequency calibration loop comprises a frequency detector and a register controller; and wherein the method further includes the following step:
    the frequency detector detects a difference in frequency between the second frequency division signal and the filtered signal, and based on the detected difference in frequency, the register controller modulates the natural frequency of oscillation of the injection-locked oscillator.

10. The method of operating a frequency synthesizer according to claim 8, wherein the phase calibration loop comprises a phase detector and an up/down counter; and wherein the method further includes the following step:
    the phase detector detects a difference in phase between the second frequency division signal and the filtered signal, and based on the detected difference in phase, the up/down counter outputs the second control signal to control the digitally controlled delay line.

11. The method of operating a frequency synthesizer according to claim 10, wherein the phase detector is a D flip-flop.

12. The method of operating a frequency synthesizer according to claim 8, further including the following step:

the noise filtering fractional-n frequency synthesizer circuit uses a delta-sigma modulator to switch between divisors, wherein the delta-sigma modulator is coupled to a frequency divider.

13. The method of operating a frequency synthesizer according to claim 12, wherein the frequency divider is a multi-modulus divider.

14. The method of operating a frequency synthesizer according to claim 8, further including the following step:
the noise filtering fractional-n frequency synthesizer circuit uses a multiplexer to switch between the second frequency division signal and the filtered signal to generate a feedback signal.

* * * * *